(12) United States Patent
Ishikawa

(10) Patent No.: US 8,206,077 B2
(45) Date of Patent: Jun. 26, 2012

(54) OVERHEAD TRANSPORTATION SYSTEM AND METHOD OF TRANSFERRING ARTICLE

(75) Inventor: Kazuhiro Ishikawa, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 191 days.

(21) Appl. No.: 12/724,509

(22) Filed: Mar. 16, 2010

(65) Prior Publication Data

US 2010/0239400 A1 Sep. 23, 2010

(30) Foreign Application Priority Data

Mar. 17, 2009 (JP) ................................ 2009-063994

(51) Int. Cl.
*B65G 1/04* (2006.01)
*B65G 65/00* (2006.01)
(52) U.S. Cl. .......................... 414/626; 212/332; 414/940
(58) Field of Classification Search .................. 414/626, 414/940, 282; 212/332
See application file for complete search history.

(56) References Cited

U.S. PATENT DOCUMENTS

| | | | |
|---|---|---|---|
| 5,997,398 A | 12/1999 | Yamada et al. | |
| 6,129,496 A | 10/2000 | Iwasaki et al. | |
| 7,413,396 B2 * | 8/2008 | Ito | 414/626 |
| 7,516,859 B2 * | 4/2009 | Taniguchi | 212/332 |
| 7,780,020 B2 * | 8/2010 | Yoshitaka | 212/332 |
| 7,972,104 B2 * | 7/2011 | Shiwaku et al. | 414/282 |
| 2004/0109746 A1 * | 6/2004 | Suzuki | 414/373 |
| 2005/0139564 A1 | 6/2005 | Nakao et al. | |
| 2006/0051188 A1 * | 3/2006 | Hoshino | 414/277 |
| 2006/0182553 A1 * | 8/2006 | Yamamoto et al. | 414/278 |
| 2007/0163461 A1 | 7/2007 | Shiwaku | |
| 2008/0217268 A1 | 9/2008 | Yoshida et al. | |

FOREIGN PATENT DOCUMENTS

| | | |
|---|---|---|
| EP | 1 683 745 A1 | 7/2006 |
| JP | 05-000708 A | 1/1993 |
| JP | 06-191634 A | 7/1994 |
| JP | 06-286811 A | 10/1994 |
| JP | 07-157073 A | 6/1995 |
| JP | 10-045213 A | 2/1998 |
| JP | 2000-053237 A | 2/2000 |
| JP | 2000-099151 A | 4/2000 |
| JP | 2005-206371 A | 8/2005 |
| JP | 2005-294280 A | 10/2005 |
| JP | 2006-224944 A | 8/2006 |
| JP | 2007-191235 A | 8/2007 |

OTHER PUBLICATIONS

Official Communication issued in corresponding Japanese Patent Application No. 2009-063994, mailed on Jan. 28, 2011.

* cited by examiner

*Primary Examiner* — James Keenan
(74) *Attorney, Agent, or Firm* — Keating & Bennett, LLP

(57) ABSTRACT

An overhead shuttle is controlled to support a bottom of an article while traveling. A transfer apparatus is controlled to hold the article from above the article, move the article between a position above the overhead shuttle and a position above stations provided on a side of a travel rail, and elevate and lower the article to transfer the article between the transfer apparatus and the station.

8 Claims, 10 Drawing Sheets

F I G. 1
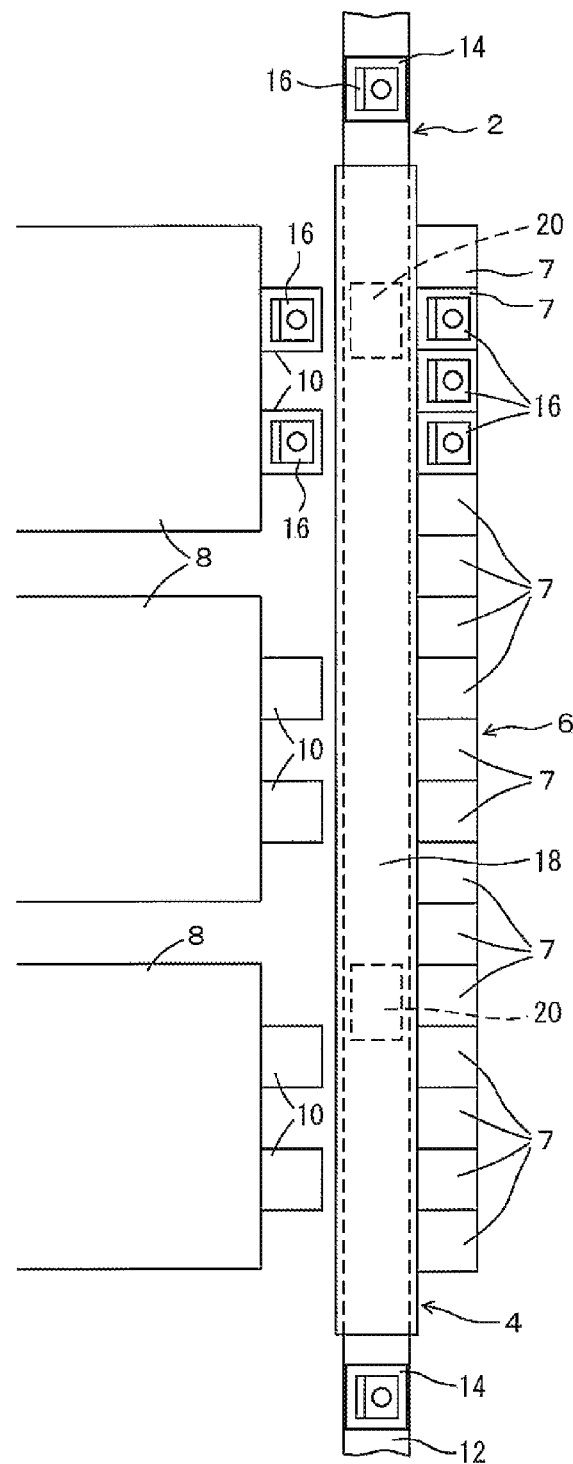

F I G. 2
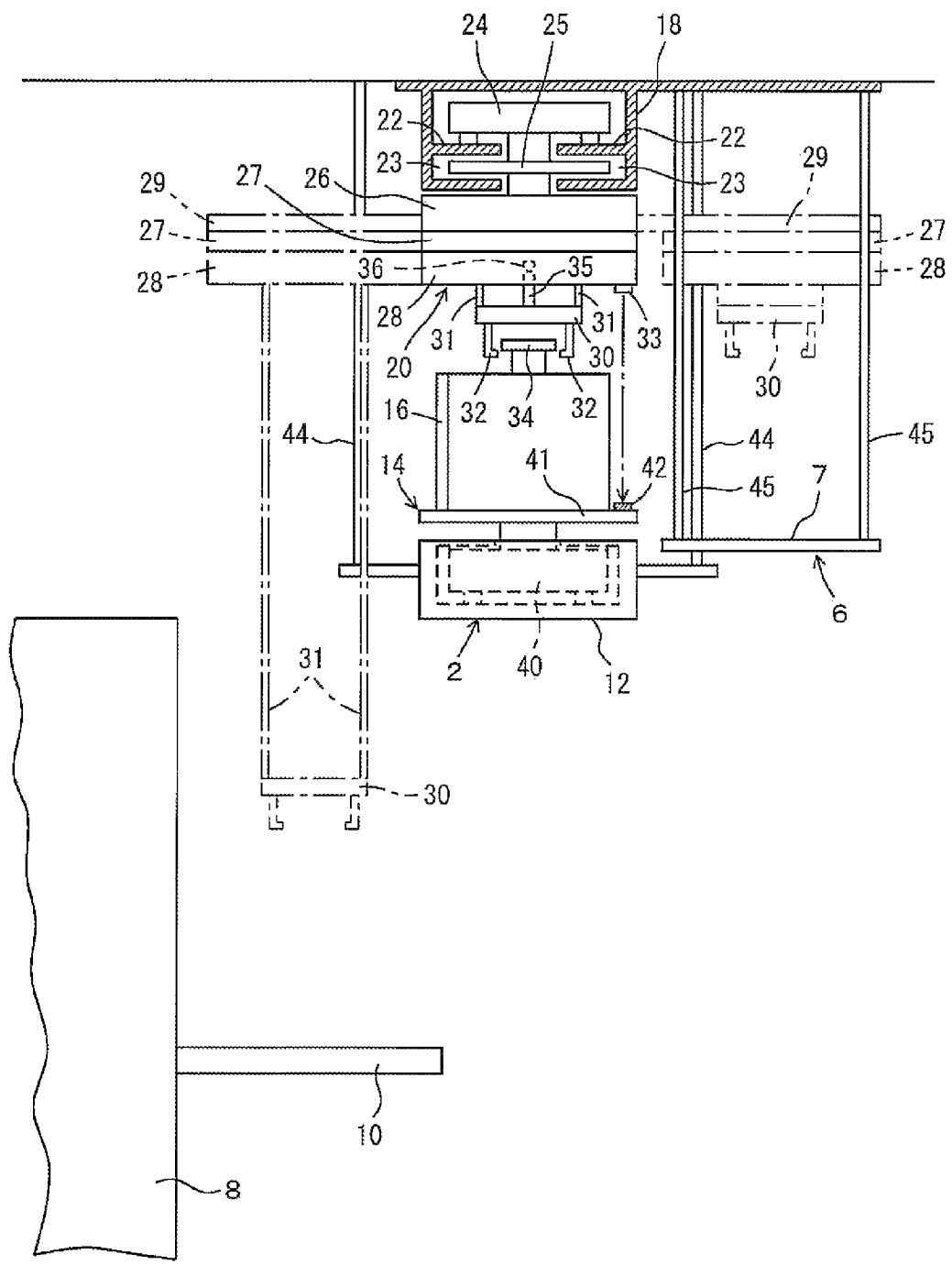

F I G. 3
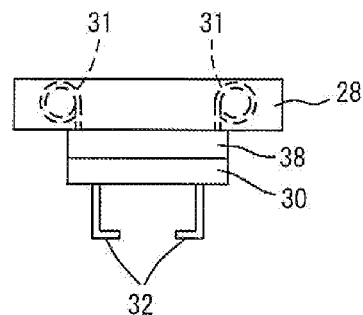
F I G. 4
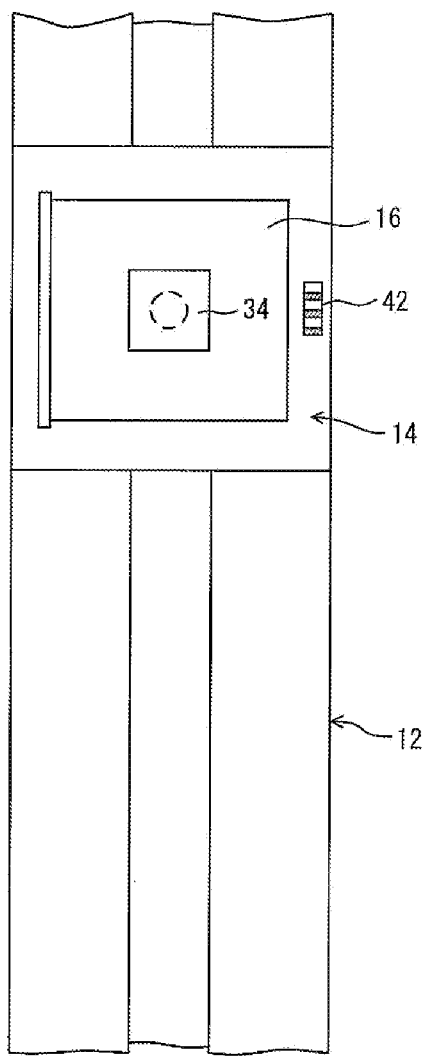

F I G. 5
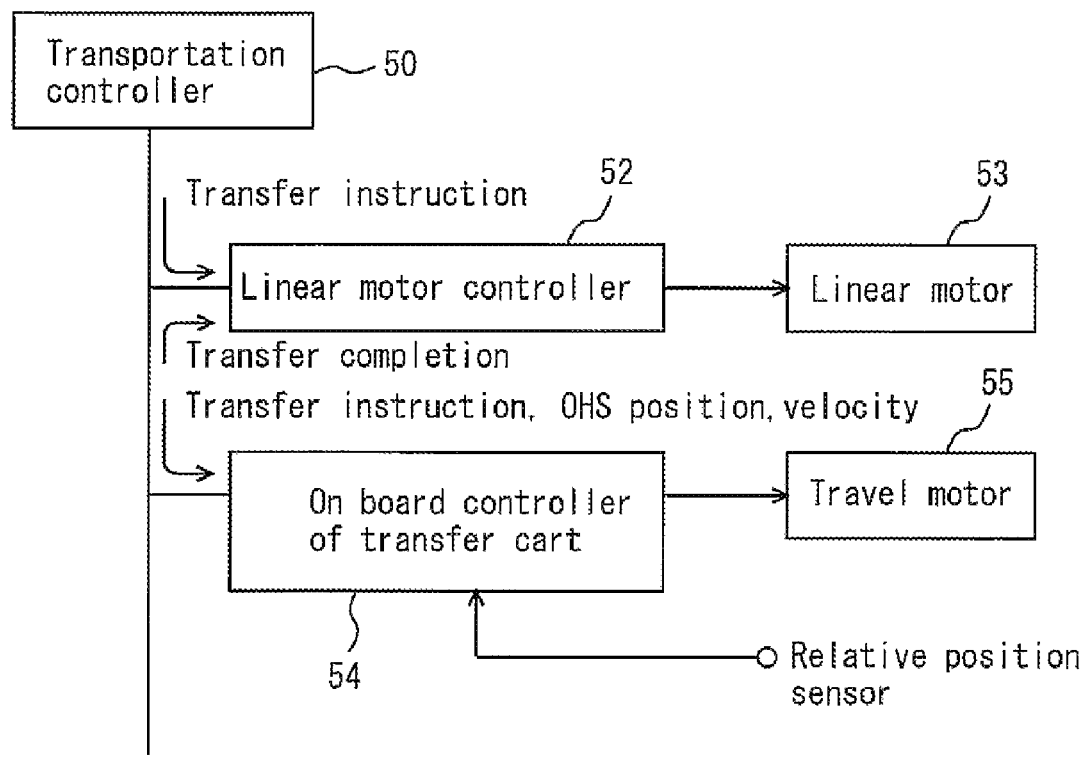

F I G. 7
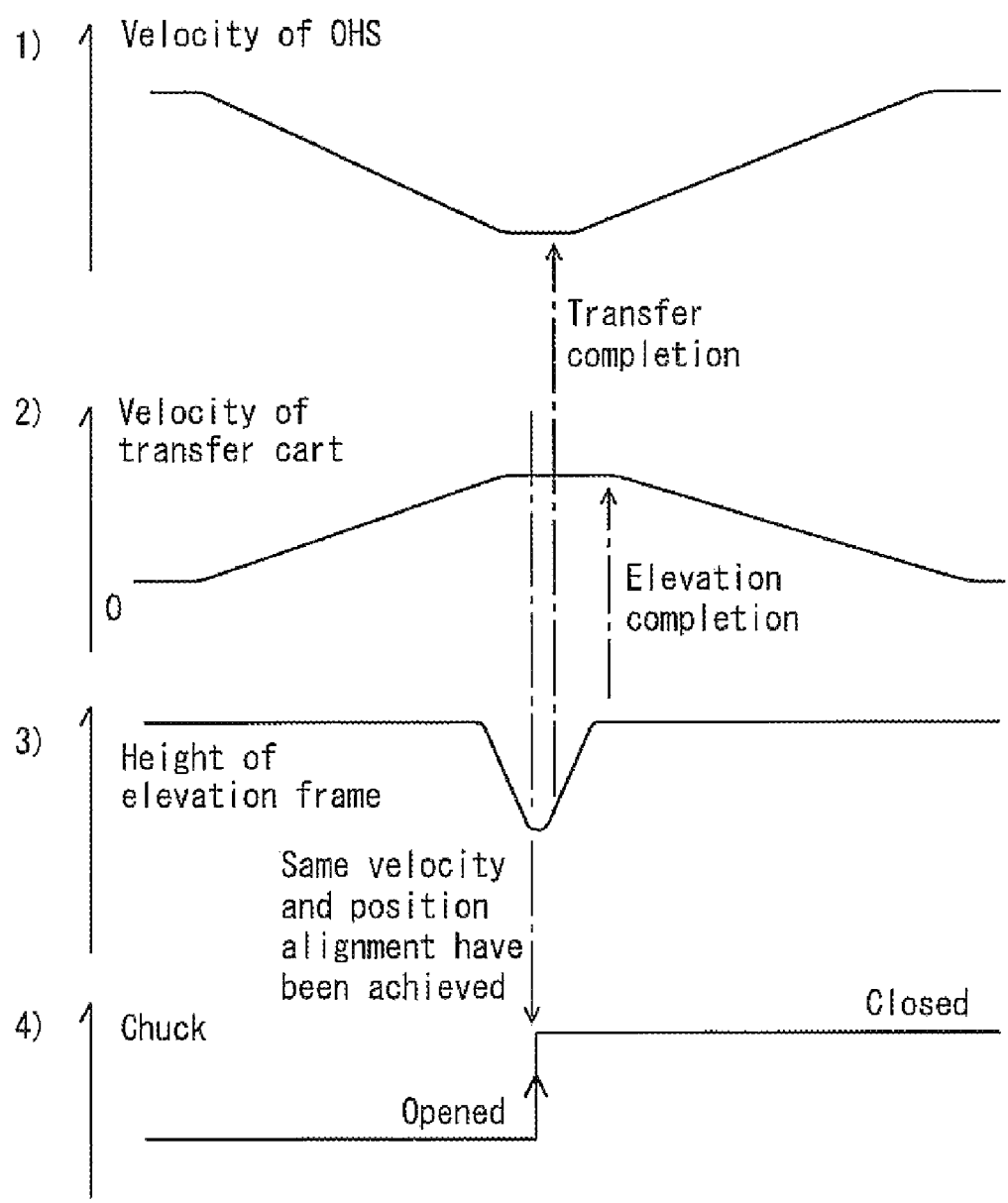

OVERHEAD TRANSPORTATION SYSTEM AND METHOD OF TRANSFERRING ARTICLE

BACKGROUND OF THE INVENTION

1. Field of the Invention

The present invention relates to transfer of an article in an overhead transportation system.

2. Description of the Related Art

As a problem of the overhead transportation system, when an overhead shuttle (OHS: Over Head Shuttle) is stopped on a travel route for transfer of an article, the travel route is blocked by the overhead shuttle, and a traffic jam may occur. In this regard, according to the disclosure of JP2006-224944A, buffers are provided below a travel rail for a first overhead shuttle, and the first overhead shuttle transfers articles only to or from the buffers. Further, a second overhead shuttle that travels along another travel rail transfers articles between the buffers and stations. In this case, since the article is transferred between the first overhead shuttle and the buffer by elevating and lowering an elevation frame, the first overhead shuttle is stopped above the buffer for a long period of time. In the meanwhile, the travel route is blocked by the first overhead shuttle.

SUMMARY OF THE INVENTION

Preferred embodiments of the present invention shorten a period of stop time needed for an overhead shuttle to transfer an article to prevent disturbance of traveling of subsequent overhead shuttles.

According to a preferred embodiment of the present invention, an overhead transportation system includes a station provided on a ground and an overhead shuttle system provided on a ceiling. The overhead shuttle system includes an overhead shuttle configured to support a bottom of an article while the overhead shuttle is traveling, and a travel rail provided on a bottom side of the overhead shuttle.

The overhead transportation system further includes a transfer apparatus arranged to releasably hold the article from above the article to transfer the article between the transfer apparatus and the overhead shuttle, laterally move the article between a position above the overhead shuttle and a position above the station provided on a side of the travel rail, and elevate and lower the article to transfer the article between the transfer apparatus and the station.

According to another preferred embodiment of the present invention, a method of transferring an article between a station provided on a ground and an overhead shuttle on a ceiling, in an overhead transportation system, includes the steps of controlling the overhead shuttle to support a bottom of an article and travel along a travel rail, controlling a transfer apparatus to hold and release the article from above the overhead shuttle to transfer the article between the transfer apparatus and the overhead shuttle, controlling the transfer apparatus to laterally move the article between a position above the overhead shuttle and a position above the station provided on a side of the travel rail, and controlling the transfer apparatus to elevate and lower the article to transfer the article between the transfer apparatus and the station.

It is preferable that description regarding the overhead transportation system is directly applicable to the transfer method in the overhead transportation system, and conversely, description regarding the transfer method is directly applicable to the overhead transportation system. The overhead shuttle may be stopped or may be traveling during transfer of the article between the overhead shuttle and the transfer apparatus.

Operation of various preferred embodiments of the present invention will be described assuming that the article is transferred from the overhead shuttle to the station. In the case of transferring the article from the station to the overhead shuttle, the respective steps should be carried out in the reverse order. In various preferred embodiments of the present invention, the article on the overhead shuttle preferably is held by the transfer apparatus from above the article, and the transfer apparatus preferably moves the article on the overhead shuttle toward a side of the travel rail to avoid interference with the subsequent overhead shuttles and other articles on overhead shuttle. Then, the transfer apparatus elevates and lowers the article to transfer the article to the station. The overhead shuttle does not have to elevate or lower the elevation frame for transfer of the article, and transfer can be completed in a short period of time. Further, since the transfer apparatus is used for moving the article toward the side of the travel rail, the subsequent overhead shuttles can promptly pass through the position where transfer of the article is carried out. Therefore, operation in the overhead transportation system is performed highly efficiently. Further, since the overhead shuttle is not required to be equipped with the transfer apparatus, the overhead shuttle can have simple structure, and can be operated at high speed.

Preferably, the transfer apparatus includes an elevation frame arranged to hold the article from above the article, an elevation driver arranged to elevate and lower the elevation frame, and a lateral driver arranged to laterally move the elevation driver between a position above the travel rail and a position above the station. In this structure, the article can be transferred to the side of the travel rail quickly, and elevated and lowered between the travel rail and the station.

Preferably, the overhead transportation system includes a travel rail for the transfer apparatus arranged to allow the transfer apparatus to travel parallel or substantially parallel to the travel rail for the overhead shuttle. In this structure, the overhead shuttle can transfer the article to or from the transfer apparatus at any position. Further, it becomes possible to transfer the article without stopping the overhead shuttle, and transport the article at even much higher speed.

In the case where a buffer that allows the transfer apparatus to transfer the article to or from the buffer freely is provided, regardless of whether the station is available or not, the transfer apparatus can transfer the article to or from the overhead shuttle. Likewise, the transfer apparatus can transfer the article to or from the station regardless of whether the overhead shuttle is available or not.

With regard to the layout of the buffer, the travel rail for the overhead shuttle is provided below the travel rail for the transfer apparatus, and overlapped with the travel rail for the transfer apparatus in a plan view. Further, the buffer is provided on one of left and right sides of the travel rail for the transfer apparatus, and the station is provided on the other of left and right sides of the travel rail for the transfer apparatus. In this layout, the lateral driver of the transfer apparatus is configured to laterally move the article toward both of the left and right sides. In the case where the article is transferred to or from the overhead shuttle, since it is not necessary to operate the lateral driver, the article can be transferred reliably.

The travel rail for the overhead shuttle may be provided below the travel rail for the transfer apparatus on one of left and right sides, and the station may be provided below the travel rail for the transfer apparatus, and overlapped with the travel rail for the transfer apparatus in a plan view. In this layout, when the article is drawn by the lateral driver to a position below the travel rail for the transfer apparatus, interference between the article held by the transfer apparatus and the overhead shuttle is eliminated. Therefore, the time period of interference between the article held by the transfer apparatus and the overhead shuttle is shortened. Accordingly, improvement in the transportation performance in the overhead shuttle system is achieved.

Preferably, the buffer is provided on the other of left and right sides of the travel rail for the transfer apparatus. In this manner, the transfer apparatus can transfer the article between the buffer and the station without interference with the overhead shuttle.

Preferably, the buffer is provided below the travel rail for the transfer apparatus, between the station and another station, and overlapped with the travel rail for the transfer apparatus in a plan view. Also in this layout, the transfer apparatus can transfer the article between the buffer and the station without interference with the overhead shuttle system.

Preferably, the buffer is provided below the travel rail for the overhead shuttle, and overlapped with the overhead shuttle in a plan view. Also in this layout, the transfer apparatus can transfer the article between the buffer and the station without interference with the overhead shuttle system.

Other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a plan view showing main components of an overhead transportation system according to a first preferred embodiment of the present invention.

FIG. 2 is an enlarged front view showing main components of the overhead transportation system according to the first preferred embodiment of the present invention.

FIG. 3 is a front view showing a pantagraph between an elevation driver and an elevation frame according to a modified first preferred embodiment of the present invention.

FIG. 4 is a plan view showing an overhead shuttle and a travel rail in the vicinity of the overhead shuttle according to the first preferred embodiment of the present invention.

FIG. 5 is a block diagram showing a control system according to first preferred embodiment of the present invention.

FIG. 7 is a timing chart for transfer between the overhead shuttle and the transfer cart, where a graph 1) shows the velocity of the overhead shuttle; a graph 2) shows the velocity of the transfer cart; a graph 3) shows the height of the elevation frame; and a graph 4) shows opening and closing of a chuck, according to the first preferred embodiment of the present invention.

DETAILED DESCRIPTION OF THE PREFERRED EMBODIMENTS

Figure 6:
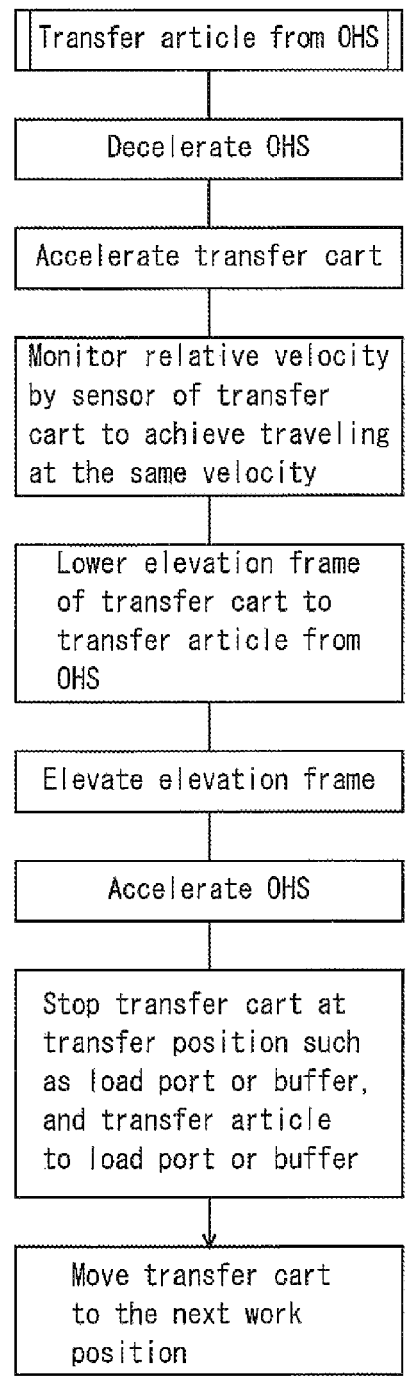
FIG. 6 is a flow chart showing an algorithm of transfer between an overhead shuttle and a transfer cart according to the first preferred embodiment of the present invention.

Hereinafter, preferred embodiments in the most preferred form will be described. The preferred embodiments can be modified suitably with reference to techniques known in this technical field. Therefore, the preferred embodiments should not be construed as limiting the scope of the present invention.

FIGS. 1 to 11 show preferred embodiments and modification of the preferred embodiments. FIGS. 1 to 7 show a first preferred embodiment and its modification. An overhead transportation system includes an overhead shuttle system 2, a transfer cart system 4, and a buffer system 6. For example, the overhead transportation system may be provided in a clean room of a factory for manufacturing semiconductors, a factory for manufacturing flat panel displays, or the like. Reference numerals 8 denote processing equipment for processing semiconductors, flat panel displays, or the like. Reference numerals 10 denote load ports. The load ports 10 are examples of stations. The overhead shuttle system 2 and the transfer cart system 4 are provided along a line of the processing equipment 8. As viewed from the transfer cart system 4, the buffer system 6 is provided oppositely to the line of the processing equipment 8. A large number of buffers 7 are provided in the buffer system 6.

As shown, e.g., in FIG. 2, the overhead shuttle system 2 includes a linear motor rail 12 and an overhead shuttle (OHS) 14. The linear motor rail 12 includes a primary side of a linear motor (not shown), and the overhead shuttle 14 includes a secondary side of the linear motor. Further, a reference numeral 16 denotes one of articles such as cassettes, e.g., each containing one or a plurality of semiconductor substrates or flat panel display substrates. The transfer cart system 4 includes a travel rail 18 in the vicinity of a ceiling of the clean room. The linear motor rail 12 of the overhead shuttle system 2 is provided below the travel rail 18 for allowing the overhead shuttle 14 to travel above the linear motor rail 12. The linear motor rail 12 is provided below the travel rail 18, and overlapped with the travel rail 18 in a plan view. Buffers 7 are provided on one of left and right sides of the travel rail 18, and load ports 10 are provided on the other of left and right sides of the travel rail 18.

It should be noted that the linear motor rail 12 of the overhead shuttle system 2 is also referred to as the travel rail in the claims. Further, a rotary travel motor may be provided for the overhead shuttle 14. However, in the case where the primary side of the linear motor is provided in the linear motor rail 12, and the secondary side of the linear motor is provided in the overhead shuttle 14, centralized control of a large number of the overhead shuttles 14 can be implemented on the ground side for allowing the overhead shuttles 14 to travel at high speed with a short inter-vehicle distance. Further, the overhead shuttles 14 and transfer carts 20 as described later can be controlled to travel at the same velocity easily.

Reference numerals 20 denote the transfer carts. Known overhead shuttles can be used as the transfer carts 20. The travel rail 18 includes a travel surface 22 and a power feeder 23. Each of the transfer carts 20 includes, from upper to lower positions, a travel unit 24, a power receiving unit 25, a lateral drive unit 26, a rotary drive unit 27, an elevation driver 28, and an elevation frame 30. In the present preferred embodiment, the travel unit 24 of the transfer cart 20 is supported on the travel surface 22 inside the travel rail 18 so as to allow autonomous traveling of the transfer cart 20. Alternatively, the transfer cart 20 itself may travel using forces applied from belts, chains, screw rods or the like. Further, the travel unit 24 preferably includes the rotary motor. Alternatively, the travel unit 24 may include a linear motor. The power receiving unit 25 receives electricity from the power feeder 23, and communicates with a controller (not shown) on the ground through a wireless LAN or the like. Electricity may be received by the power receiving unit 25 in a non-contact manner. Alternatively, electricity may be received through a power line such as a cableveyor.

The lateral drive unit 26 laterally moves the rotary drive unit 27, the elevation driver 28, and the elevation frame 30 below the elevation driver 28, e.g., toward both of left and right sides in the traveling direction of the transfer cart 20. The rotary drive unit 27 rotates the elevation driver 28 and the elevation frame 30 within a horizontal plane. The rotary drive unit 27 may not be provided. The elevation driver 28 elevates and lowers the elevation frame 30 preferably by using suspension members 31. A chuck 32 is preferably provided in the elevation frame 30. The chuck 32 can hold and release an engagement member 34 provided above the article 16.

In the present preferred embodiment, the lateral drive unit 26 laterally moves the elevation driver 28. Alternatively, the elevation driver 28 may laterally move the lateral drive unit 26 and the elevation frame 30. A relative position sensor 33 is arranged to measure a relative position in a traveling direction of a transfer cart 20 relative to the overhead shuttle 14, and determines a relative velocity between the transfer cart 20 and the overhead shuttle 14 based on changes of the relative position.

The article 16 is transferred by controlling the overhead shuttle 14 and the transfer cart 20 to travel in parallel at the same velocity, and elevating and lowering the elevation frame 30 by the elevation driver 28, e.g., by the stroke of several millimeters. At this time, a force corresponding to the wind pressure applied to the article 16 varies depending on whether the article 16 is held by the elevation frame 30 or not. In order to prevent vibration of the elevation frame 30 along the traveling direction, a pin 35 is provided for one of the elevation frame 30 and the elevation driver 28, and the pin 35 is engaged with a pin hole 36 of the other of the elevation frame 30 and the elevation driver 28 to fix the position of the elevation frame 30 relative to the elevation driver 28 in the traveling direction. The pin 35 and the pin hole 36 are not essential. Any positioning elements or means can be adopted as long as the elevation frame 30 is accurately positioned in the traveling direction relative to the elevation driver 28. For transfer of the article 16 to or from the load port 10, the elevation frame is lowered by a large stroke to pull the pin 35 out of the pin hole 36, and the elevation frame 30 is elevated to return the pin 35 into the pin hole 36.

The overhead shuttle 14 has a travel unit 40, and the secondary side of a linear motor (not shown) is provided in the travel unit 40. Further, the overhead shuttle 14 has a support unit 41 protruding above the linear motor rail 12 to support the bottom of the article 16. For example, a mark 42 is provided on an upper surface of the support unit 41. The mark 42 is read by the relative position sensor 33 of the transfer cart 20 so as the detect the relative position. Masts 44, 45 are arranged such that the mast 44 supports the linear motor rail 12 by the ceiling of the clean room or the like and the mast 45 supports a buffer system 6 by the ceiling of the clean room or the like. Alternatively, the buffer system 6 may be supported by the linear motor rail 12.

FIG. 3 shows a modified preferred embodiment where a pantograph 38 is provided between the elevation driver 28 and the elevation frame 30. By elevating and lowering the pantograph 38 using suspension members 31, the elevation frame 30 is elevated and lowered by a small stroke. At the time of transferring the article to or from the overhead shuttle 14, the pantograph 38 is used to elevate and lower the elevation frame 30. In this manner, at the time of transferring the article 16 to or from the overhead shuttle 14, even if the force applied to the elevation frame 30 is changed by the degree corresponding to the wind pressure applied to the article 16, the elevation frame 30 is not easily vibrated back and forth in the traveling direction. Therefore, the article 16 can be transferred further smoothly.

FIG. 4 shows the mark 42 on the overhead shuttle 14. The mark 42 preferably is a one-dimensional or two-dimensional barcode, for example. The relative position sensor 33 includes an optical sensor such as a line sensor or a CCD sensor and an image processor. For example, it is assumed that the relative velocity between the transfer cart and the overhead shuttle 14 is about 1 mm/sec or less, and the positional error in the traveling direction is about 0.1 mm or less. In this case, the relative position sensor 33 preferably has a resolution of about 0.33 mm, and the mark 42 is imaged by the sensor 33, e.g., at intervals of about 0.03 second, for example, and the difference between the previous image and the current image is determined. In the case where the relative velocity is about 1 mm/sec or less, the shift of the images captured at intervals of about 0.03 second is less than the resolution, and the difference is almost zero. In the case where the relative velocity has a wide tolerance range, the sensor resolution can be reduced, and in the case where the time of measurement by the sensor is shortened, a higher resolution needs to be adopted.

In this configuration, it is possible to determine that the relative velocity is sufficiently small, and position alignment can be made at the same time. By writing an ID or the like of the overhead shuttle 14 in the barcode, the transfer cart 20 can confirm the ID of the overhead shuttle 14. The position alignment of the transfer cart 20 with the overhead shuttle 14 can be made using any optical mark and any optical sensor without using the barcode. In the case where the tolerance error of the relative velocity at the time of transfer or the like is large, the relative position sensor 33 and the mark 42 is not essential and may be omitted.

FIG. 5 shows a control system of the overhead transportation system. A transportation controller 50 implements overall control of the overhead transportation system, and the linear motor controller 52 controls a linear motor in a linear motor rail to control traveling of the overhead shuttles 14. An on board controller 54 of the transfer cart controls the transfer cart, and controls a travel motor 55 to allow the transfer cart to travel at the same velocity with the overhead shuttle for transfer of the article between the transfer cart and the overhead shuttle.

At the time of transfer of the article between the overhead shuttle and the transfer cart, the transportation controller 50 outputs a transfer instruction. The transfer instruction indicates a position where transfer should be carried out, and which overhead shuttle and which transfer cart should be used for the transfer. At the time of carrying out transfer, the overhead shuttle and the transfer cart have constant velocity patterns. The controllers 52, 54 store these velocity patterns, and control the linear motor 53 and the travel motor 55 in accordance with the transfer instruction. Further, the linear motor controller 52 notifies a position and a velocity of the overhead shuttle (OHS) to the transfer cart, as the opponent of transfer against the transfer cart. Based on the data, the transfer cart reduces the relative speed relative to the overhead shuttle, and controls the relative position for carrying out precise position alignment between the transfer cart and the overhead shuttle, and allowing the transfer cart and the overhead shuttle to travel at the same velocity for transfer of the article.

FIGS. 6 and 7 show an algorithm for transferring an article from an overhead shuttle to a transfer cart. When the overhead shuttle moves close to a position for carrying out the transfer, the overhead shuttle is decelerated, and the transfer cart is accelerated. The velocity pattern of the overhead shuttle is known to the transfer cart. As long as the chuck is not operated, the elevated or lowered elevation frame does not interfere with the article on the overhead shuttle. Therefore, before the velocity of the overhead shuttle becomes equal to the velocity of the transfer cart, the elevation frame is lowered. The sensor of the transfer cart monitors the relative velocity and the relative position for allowing the overhead shuttle and the transfer cart to travel at the same velocity. Then, after the position of the chuck is aligned with the position of the engagement member, the elevation frame is elevated slowly, and the article is transferred. The overhead shuttle and the transfer cart travel at the same velocity for preventing impacts applied to the article at the time of transferring the article, due to the relative velocity between the overhead shuttle and the transfer cart. The same velocity herein means that, for example, the velocity difference is 30 mm/sec or less, preferably 10 mm/sec or less, and more preferably 3 mm/sec or less. In the embedment, the velocity difference is 1 mm/sec or less. The overhead shuttle and the transfer cart need to travel at the same velocity in a period where the elevation frame is elevated slowly, and support of the article is switched from the overhead shuttle to the transfer cart.

When the article is transferred, the force applied to the elevation frame is changed. Therefore, vibration of the elevation frame is prevented by the pin, the pantagraph or the like. Completion of the transfer is detected by a load sensor (not shown) provided in the chuck of the elevation frame, and elevation of the elevation frame is accelerated, and the transfer cart notifies completion of the transfer to the linear motor controller 52. Thus, the overhead shuttle is accelerated. After waiting for completion of elevation of the elevation frame, the transfer cart starts deceleration, and travels to a buffer or a load port where the article is unloaded, and then, the transfer cart is stopped. In the case of transferring the article from the transfer cart to the overhead shuttle, the transfer cart and the overhead shuttle are controlled to travel almost at the same velocity. Then, while lowering the elevation frame, the transfer cart and the overhead shuttle are controlled to be aligned, and travel at the same velocity. After the velocity of the transfer cart becomes equal to the velocity of the overhead shuttle, and the transfer cart is aligned with the overhead shuttle, the elevation frame is lowered slightly, and the support for the article is switched from the transfer cart to the overhead shuttle. When the load sensor detects completion of the transfer, the overhead shuttle is accelerated again. The transfer cart opens the chuck and further lowers the elevation frame to avoid interference with the article. Then, elevation of the elevation frame and deceleration of the transfer cart are started.

Referring back to FIG. 2, the lateral drive unit 26 laterally moves components such as the elevation driver 28 between the buffer 7 and the transfer cart 20. Further, at the time of transferring the article between the buffer 7 and the load port 10, the lateral drive unit 26 laterally moves components such as the elevation driver 28, and the elevation driver 28 elevates, and lowers the elevation frame 30 for transferring the article. A reference numeral 29 in FIG. 2 denotes a top portion of the lateral drive unit 26. In the lateral drive unit 26, the top portion 29 moves to left and right most significantly. The transfer cart 20 does not travel, and the transfer cart 20 is stopped at the time of transferring the article to or from the buffer 7 and the load port 10.

The travel rail 18 of the transfer cart system 4 is preferably arranged parallel or substantially parallel to, and above the linear motor rail 12 of the overhead shuttle system 2. The buffer system 6 and the load port 10 are provided on the left and right sides of the travel rail 18. Further, one travel rail 18 is allocated to a plurality of units of processing equipment 8. Preferably, a plurality of transfer carts 20 are controlled to travel along one travel rail 18, and articles are supplied to, and retrieved from the units of the processing equipment 8. In this manner, using the transfer carts 20, articles are supplied to, and retrieved from the processing equipment where operation is carried out intensively.

In the present preferred embodiment, the following effects and advantages are obtained.

(1) The overhead shuttle 14 can transfer the article 16 without stopping. Although the overhead shuttle 14 is decelerated, it does not block the travel route long enough to interrupt traveling of the subsequent overhead shuttles, in comparison with the case where the overhead shuttle 14 is stopped for transfer of the article 16. Instead of decelerating the overhead shuttle 14, the transfer cart 20 may be accelerated to the normal velocity of the overhead shuttle 14 for transfer of the article 16. However, in this case, transfer of the article is difficult.

(2) The transfer cart 20 can supply the article 16 to, and retrieve the article 16 from the load port 10. Using the buffer system 6, the article 16 can be stored temporarily.

(3) In the overhead shuttle 14, the support unit 41 is provided at an upper position. In the transfer cart 20, the elevation frame 30 is oriented downwardly. In this structure, transfer of the article 16 can be carried out without interference between the overhead shuttle 14 and the transfer cart 20. The elevation frame 30 may hold the engagement member 34 by attraction of an electromagnet, instead of using the chuck 32.

(4) The transfer cart 20 elevates and lowers the elevation frame 30 by a small stroke to transfer the article 16 to or from the overhead shuttle 14. The time period in which the transfer cart 20 and the overhead shuttle 14 need to travel at the same velocity is on the order of, e.g., about 0.1 second. Since the overhead shuttle 14 does not need to be stopped, for example, each of the acceleration time and the deceleration time is less than 1 second. For example, assuming that the velocity of the overhead shuttle 14 is about 5 m/sec, the acceleration of the overhead shuttle 14 is about 2.5 m/sec$^2$, and the velocity of the overhead shuttle 14 at the time of transfer of the article is about 3 m/sec, and the time period where the transfer cart 20 and the overhead shuttle 14 travel at the same velocity is about 0.1 second, the inter-vehicle distance for transfer of the article without requiring deceleration of the subsequent overhead shuttles is about 1.8 m. Further, assuming that the velocity at the time of transfer of the article 16 is about 4 m/sec, the required inter-vehicle distance is about 0.5 m, for example. Under the same conditions, if the overhead shuttle 14 is stopped for one second for transfer of the article 16, for preventing deceleration of the subsequent overhead shuttles 14, an inter-vehicle distance of 15 m is required.

(5) At the time of transfer of the article 16, the wind pressure applied to the article 16 is proportional to the square to cube of the velocity. Further, the stroke needed for acceleration or deceleration of the transfer cart 20 is proportional to the square of the velocity. Therefore, it is advantageous that the overhead shuttle 14 is decelerated in comparison with the case where the transfer cart 20 is accelerated to the normal traveling velocity of the overhead shuttle 14.

(6) Since the overhead shuttle 14 does not require any transfer mechanism, control can be implemented easily using a linear motor on the primary side on the ground. Thus, centralized control for a large number of overhead shuttles 14 can be implemented with a short inter-vehicle distance, and the transfer cart 20 and the overhead shuttle 14 can be controlled to travel at the same velocity easily.

Figure 8:
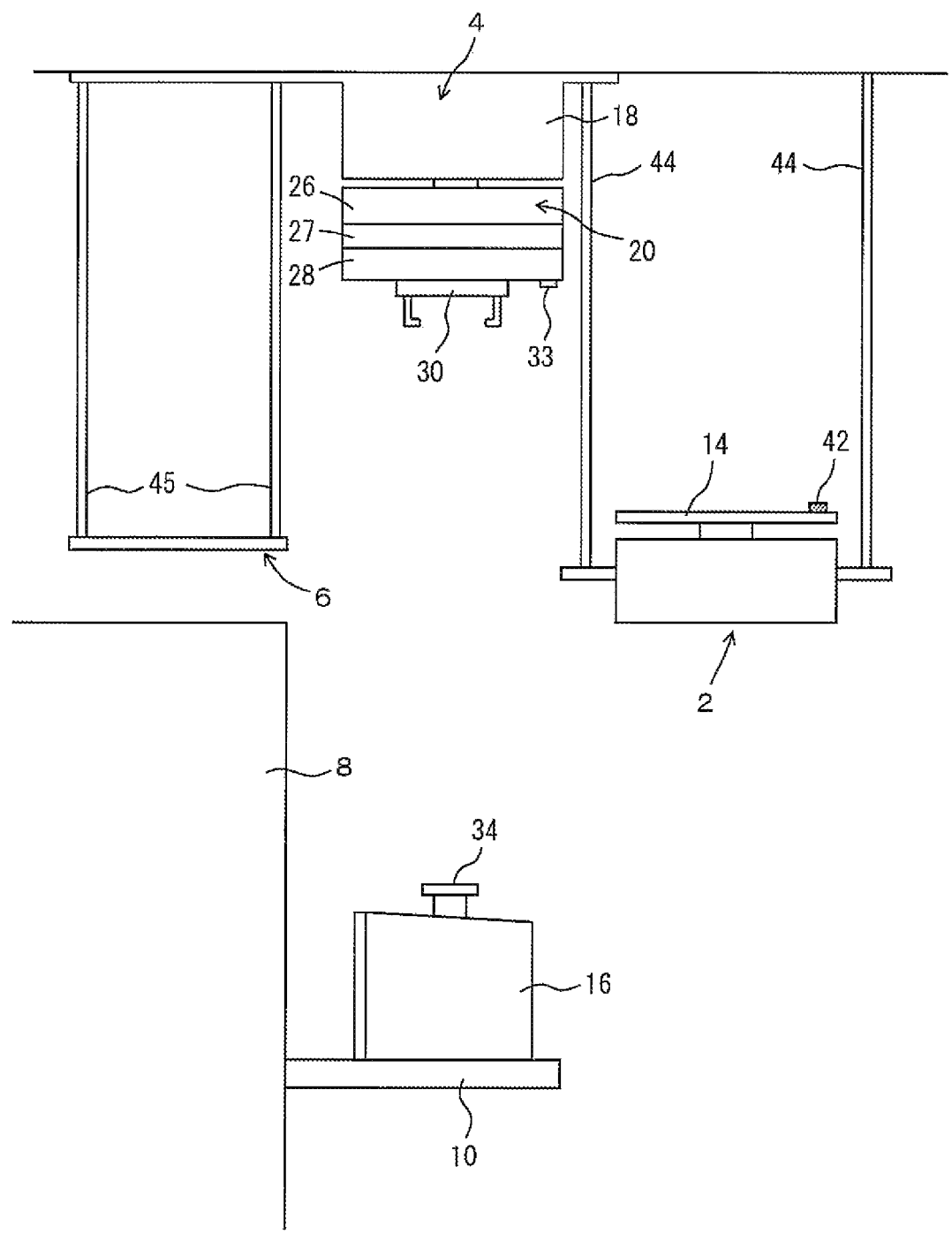
FIG. 8 is an enlarged front view showing main components according to a second preferred embodiment of the present invention.

With the structure and method shown in FIGS. 1 to 7, when the elevation frame 30 holding the article 16 passes above the linear motor rail 12, traveling of the overhead shuttle 14 is obstructed. FIGS. 8 to 11 show preferred embodiments intended to solve such a problem. The layout of the buffer system in these preferred embodiments may be adopted in combination with the layout of the buffer system 6 in FIG. 2. In FIG. 8, the buffer system 6 is provided above the processing equipment, and the load port 10 is provided immediately below the transfer cart system 4, and overlapped with the travel rail 18 in a plan view. The overhead shuttle system 2 is provided on one of the left and right sides of the travel rail 18, and the buffer system 6 is provided on the other of the left and right sides of the travel rail 18. Further, the transfer cart uses the lateral drive unit 26 to transfer the article between the transfer cart 20 and the overhead shuttle 14. In other respects, the preferred embodiment in FIG. 8 is preferably the same as the preferred embodiment in FIGS. 1 to 7. In the preferred embodiment in FIG. 8, an empty space above the processing equipment 8 may be used for providing the buffer system 6.

Figure 9:
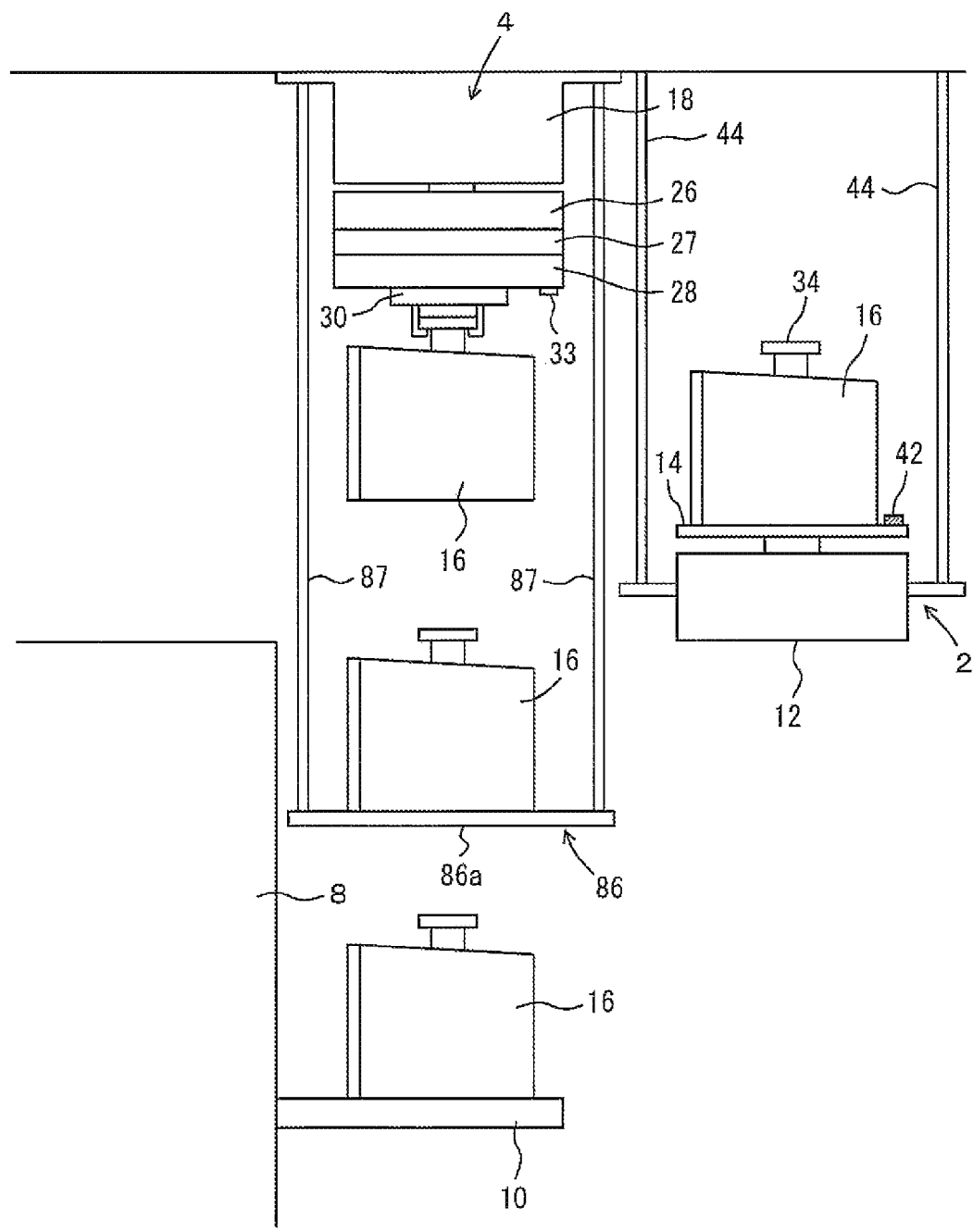
FIG. 9 is an enlarged front view showing main components according to a third preferred embodiment of the present invention.

Also in the preferred embodiment of FIG. 9, the lateral drive unit 26 is utilized to transfer the article 16 to or from the overhead shuttle 14. In this case, it is sufficient to laterally move the article 16 to or from the linear motor rail 12. It is not required to laterally move the article to both of the left and right sides. The load port 10 and a buffer system 86 are provided below the transfer cart system 4, and the load port 10 and the buffer system 86 are overlapped with the travel rail 18 in a plan view. Respective buffers 86a are provided in spaces between the load ports 10. Reference numerals 87 denote masts for supporting the buffer system 86. Alternatively, the buffer system 86 may be supported using the overhead shuttle system 2 or the like.

Figure 10:
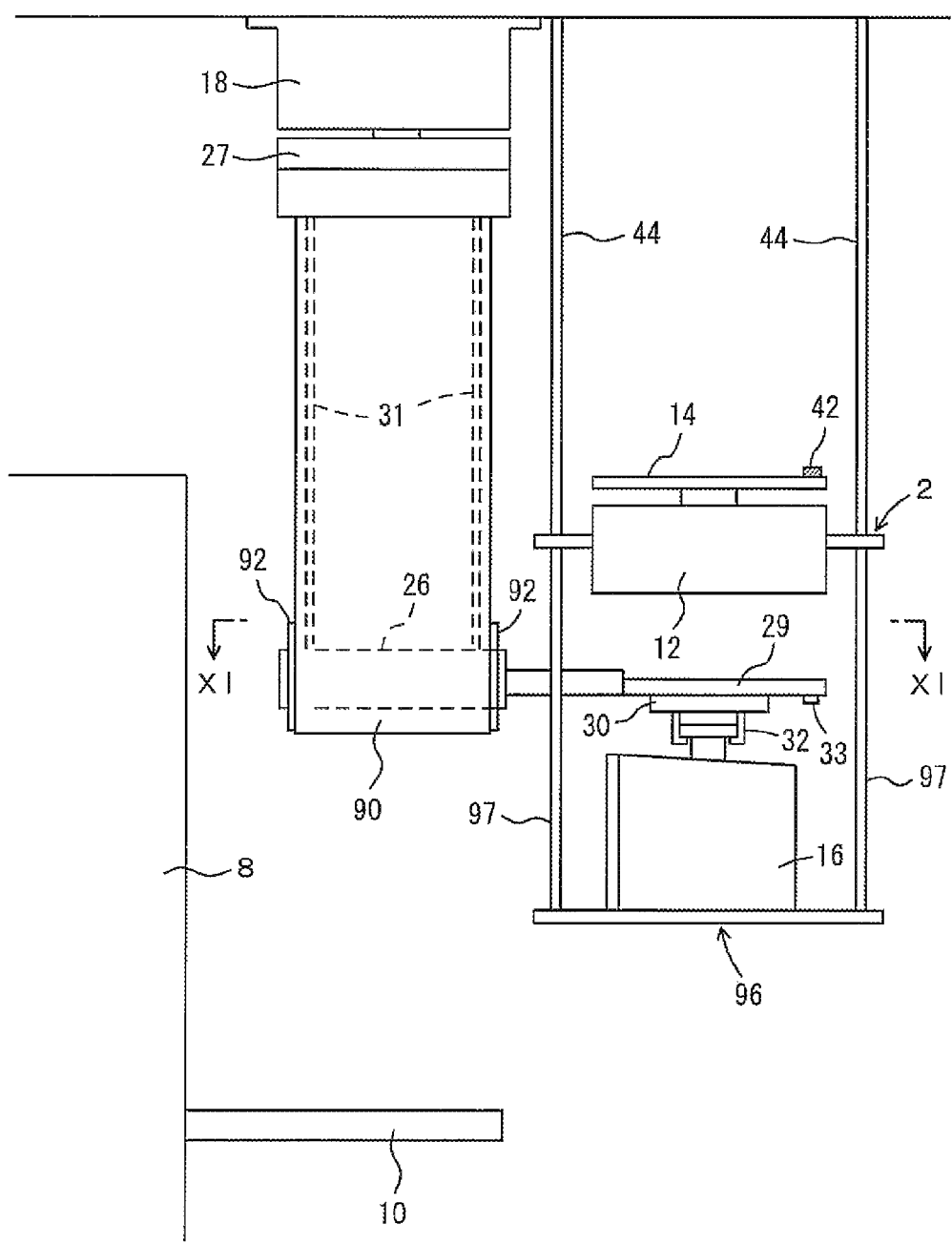
FIG. 10 is an enlarged front view showing main components in a fourth preferred embodiment of the present invention.
Figure 11:
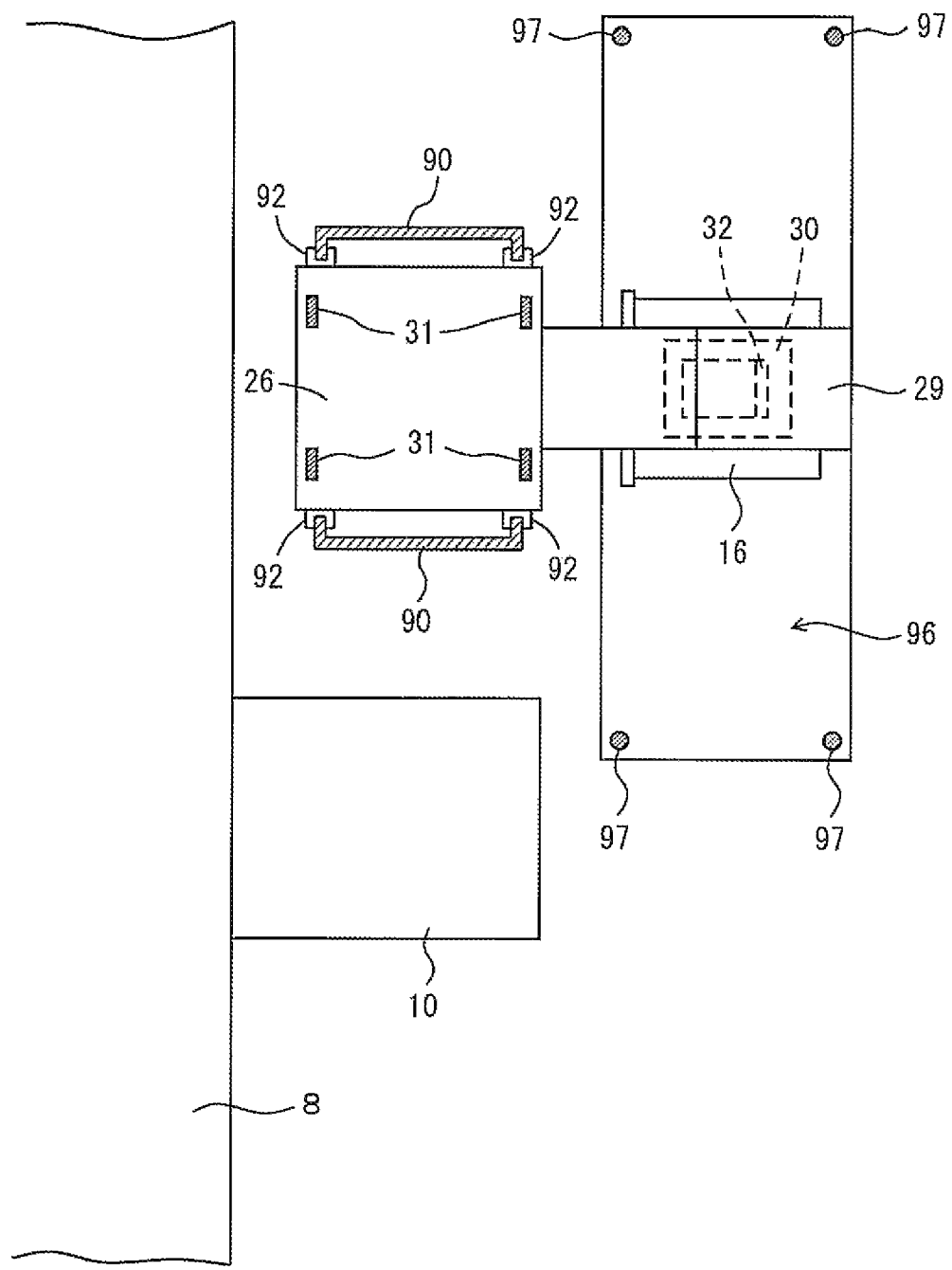
FIG. 11 is an enlarged cross sectional view taken along a direction XI-XI in FIG. 10.

In preferred embodiments of FIGS. 10 and 11, a buffer system 96 is provided in a space below the linear motor rail 12, and the buffer system 96 is overlapped with the linear motor rail in a plan view. Reference numerals 97 denote masts for supporting the buffer system 96. In the preferred embodiments of FIGS. 10 and 11, the elevation driver is provided below the rotary drive unit 27 of the transfer cart to elevate and lower the lateral drive unit 26, and the elevation frame 30 is provided at a top portion 29 of the lateral drive unit 26. In this structure, in the state where the suspension members 31 are drawn significantly, if the article 16 is transferred to or from the buffer system 6, the lateral drive unit 26 may be tilted toward the left or right side in the traveling direction undesirably. Therefore, for example, a pair of front and back guides 90 oriented downwardly are attached to the elevation driver 28 or the like, and guided members 92 are provided for the lateral drive unit 26 to guide the lateral drive unit 26 when it is elevated or lowered. In the transfer of the article to or from the load port 10, since the guides 90 are not used, the guides 90 are terminated at positions higher than the load port 10, so that the guided members 92 of the lateral drive unit 26 can pass the lower end of the guides 90 freely. It is sufficient that the lateral drive unit 26 laterally move the article 16 between the linear motor rail 12 and the buffer system 96.

The overhead shuttle 14 may be stopped to transfer the article between the overhead shuttle 14 and the transfer cart 20. In such a case, the transfer cart 20 may be a stationary transfer apparatus having no travel unit 24.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An overhead transportation system comprising:
    stations provided on a ground;
    an overhead shuttle system provided on a ceiling and including overhead shuttles configured to support a bottom of an article while the overhead shuttles are traveling, and a travel rail provided on a bottom of the overhead shuttles;
    a transfer apparatus arranged to releasably hold the article from above the article to transfer the article between the transfer apparatus and the overhead shuttles, to laterally move the article between a position above the overhead shuttles and a position above the stations provided on a side of the travel rail, and to elevate and lower the article to transfer the article between the transfer apparatus and the stations; and
    a travel rail for the transfer apparatus arranged to allow the transfer apparatus to travel parallel or substantially parallel to the travel rail for the overhead shuttles; wherein
    the transfer apparatus and the overhead shuttles are configured to travel at the same velocity or substantially the same velocity when transferring the article between the transfer apparatus and the overhead shuttles.

2. The overhead transportation system according to claim 1, further comprising a buffer arranged to temporarily store the article.

3. The overhead transportation system according to claim 2, wherein the travel rail for the overhead shuttles is provided below the travel rail for the transfer apparatus and overlapped with the travel rail for the transfer apparatus in a plan view, the buffer being provided on one of left and right sides of the travel rail for the transfer apparatus, and the stations being provided on the other of left and right sides of the travel rail for the transfer apparatus.

4. The overhead transportation system according to claim 2, wherein the travel rail for the overhead shuttles is provided below the travel rail for the transfer apparatus on one of left and right sides, and the stations are provided below the travel rail for the transfer apparatus and overlapped with the travel rail for the transfer apparatus in a plan view.

5. The overhead transportation system according to claim 4, wherein the buffer is provided on the other of left and right sides of the travel rail for the transfer apparatus.

6. The overhead transportation system according to claim 4, wherein the buffer is provided below the travel rail for the transfer apparatus, between the stations and additional stations, and overlapped with the travel rail for the transfer apparatus in a plan view.

7. The overhead transportation system according to claim 4, wherein the buffer is provided below the travel rail for the overhead shuttles, and overlapped with the overhead shuttles in a plan view.

8. A method of transferring an article between stations provided on a ground and overhead shuttles on a ceiling, in an overhead transportation system, comprising the steps of:

controlling the overhead shuttles to support a bottom of the article, and travel along a travel rail;

controlling a transfer apparatus to hold and release an article from above the overhead shuttles to transfer the article between the transfer apparatus and the overhead shuttles;

controlling the transfer apparatus to laterally move the article between a position above the overhead shuttles and a position above the stations provided on a side of the travel rail;

controlling the transfer apparatus and the overhead shuttles to travel at the same velocity or substantially the same velocity when the article is to be transferred between the transfer apparatus and the overhead shuttles; and controlling the transfer apparatus to elevate and lower the article to transfer the article between the transfer apparatus and the stations.

* * * * *